(12) United States Patent
Huang

(10) Patent No.: US 9,251,872 B2
(45) Date of Patent: Feb. 2, 2016

(54) ELECTRONIC DEVICE AND CONTROL METHOD FOR ELECTRONIC DEVICE

(71) Applicant: Realtek Semiconductor Corp., HsinChu (TW)

(72) Inventor: Shen-Kuo Huang, Hsinchu (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 0 days.

(21) Appl. No.: 14/330,004

(22) Filed: Jul. 14, 2014

(65) Prior Publication Data

US 2015/0071017 A1 Mar. 12, 2015

(30) Foreign Application Priority Data

Sep. 9, 2013 (TW) .............................. 102132466 A

(51) Int. Cl.
*G11C 7/00* (2006.01)
*G11C 7/10* (2006.01)

(52) U.S. Cl.
CPC ............ *G11C 7/1057* (2013.01); *G11C 7/1066* (2013.01); *G11C 2207/105* (2013.01)

(58) Field of Classification Search
CPC .......... G11C 5/02; G11C 5/06; G11C 11/406; G11C 2029/5602; G11C 29/56; G11C 11/5664; G11C 13/0009; G11C 13/0014; G11C 13/0016; G11C 2213/79; G11C 16/102; G11C 2029/5004; G11C 2207/105; G11C 2216/30; G11C 29/1201; G11C 29/48
USPC .............. 365/233, 52, 226, 233.13, 191, 193, 365/189.011, 51
See application file for complete search history.

(56) References Cited

U.S. PATENT DOCUMENTS

2012/0151287 A1* 6/2012 Le et al. ........................ 365/201

FOREIGN PATENT DOCUMENTS

| TW | 200307291 | 12/2003 |
| TW | 201104682 | 2/2011 |

* cited by examiner

*Primary Examiner* — Thong Q Le
(74) *Attorney, Agent, or Firm* — Winston Hsu; Scott Margo

(57) ABSTRACT

The disclosure provides an electronic device and a control method for the electronic device. The electronic device comprises: a memory unit, a metal pad, and a control unit. The metal pad is coupled to the memory unit, and utilized for receiving a first signal and a second signal. The control unit is coupled to the metal pad, and utilized for generating a control signal during a specific time period to control the first signal and the second signal received by the metal pad, to pull up a level of the first signal and to pull down a level of the second signal during the specific time period, so as to make the first signal and the second signal have a voltage difference. The disclosure can eliminate a glitch and avoid problems caused by inputting the glitch.

10 Claims, 3 Drawing Sheets

US 9,251,872 B2

ELECTRONIC DEVICE AND CONTROL METHOD FOR ELECTRONIC DEVICE

BACKGROUND OF THE INVENTION

1. Field of the Invention

The present invention relates to an electronic device and a control method for the electronic device, and more particularly, to an electronic device and a control method for the electronic device capable of eliminating input glitch.

2. Description of the Prior Art

In order to increase the writing or reading speed of synchronous dynamic random access memories (SDRAMs), double data rate three (DDR3) technology is introduced for related applications, where SDRAMs utilizing DDR3 technology can be referred to as DDR3 SDRAMs.

Please refer to FIG. 1. FIG. 1 shows a signal timing diagram of a clock signal CLK, a first data strobe signal DQS, a second data strobe signal DQS#, an input data strobe signal DQS_input, an input enable data strobe signal DQS_input enable, and an input chip data strobe signal DQS_input chip of the conventional Double Data Rate Three Synchronous Dynamic Random Access Memory (DDR3 SDRAM).

As shown in FIG. 1, when the conventional DDR3 SDRAM performs a reading operation (e.g. during the time period T0~T3 in FIG. 1), the first data strobe signal DQS and the second data strobe signal DQS# will turn on the On-Die Termination (ODT) in the chip, so as to make the first data strobe signal DQS and the second data strobe signal DQS# stay in a voltage level of ½ VDD. Since the first data strobe signal DQS and the second data strobe signal DQS# are differential signals, when the first data strobe signal DQS and the second data strobe signal DQS# have the same voltage level, a glitch will be generated. Moreover, uncertainty of switch time of the input enable data strobe signal DQS_input enable will cause inputting the glitch, and thus the conventional DDR3 SDRAM has problems of catching wrong data due to the glitch.

SUMMARY OF THE INVENTION

It is therefore one of the objectives of the present invention to provide an electronic device and a control method for the electronic device capable of eliminating a glitch and avoiding problems caused by inputting the glitch.

In accordance with an embodiment of the present invention, an electronic device is disclosed. The electronic device comprises: a memory unit, a metal pad, and a control unit. The metal pad is coupled to the memory unit, and utilized for receiving a first signal and a second signal. The control unit is coupled to the metal pad, and utilized for generating a control signal during a specific time period to control the first signal and the second signal received by the metal pad, to pull up a level of the first signal and to pull down a level of the second signal during the specific time period, so as to make the first signal and the second signal have a voltage difference. The disclosure can eliminate a glitch and avoid problems caused by inputting the glitch.

In accordance with an embodiment of the present invention, a control method for an electronic device comprising a memory unit is disclosed. The control method comprises: utilizing a metal pad coupled to the memory unit to receive a first signal and a second signal; and utilizing a control unit coupled to the metal pad to generate a control signal during a specific time period to control the first signal and the second signal received by the metal pad, to pull up a level of the first signal and to pull down a level of the second signal during the specific time period, so as to make the first signal and the second signal have a voltage difference.

Briefly summarized, compared with prior art, since the electronic device and the control method for the electronic device disclosed by the present invention can make the first signal and the second signal have a voltage difference during the specific time period, the present invention can eliminate a glitch and avoid problems caused by inputting the glitch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
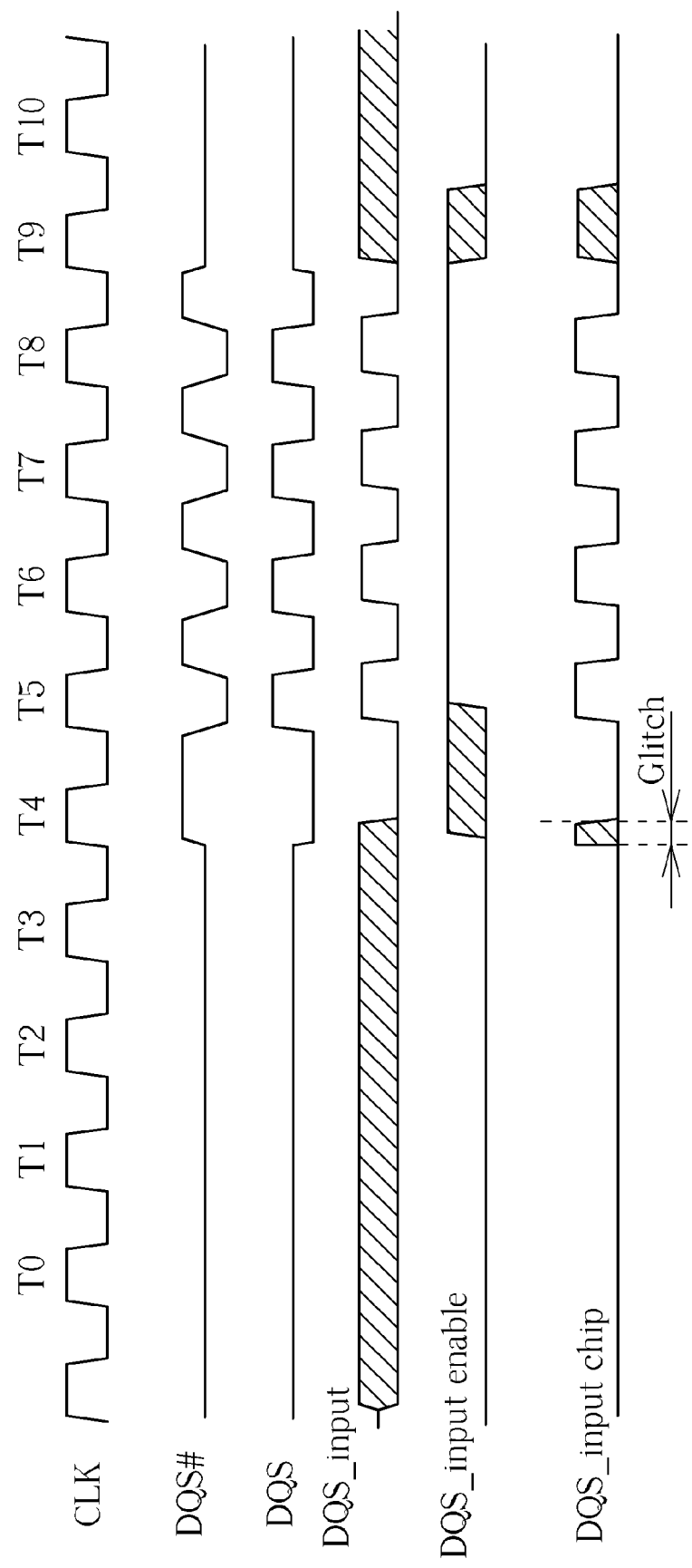
FIG. 1 shows a signal timing diagram of a clock signal CLK, a first data strobe signal DQS, a second data strobe signal DQS#, an input data strobe signal DQS_input, an input enable data strobe signal DQS_input enable, and an input chip data strobe signal DQS_input chip of the conventional Double Data Rate Three Synchronous Dynamic Random Access Memory (DDR3 SDRAM).
Figure 2:
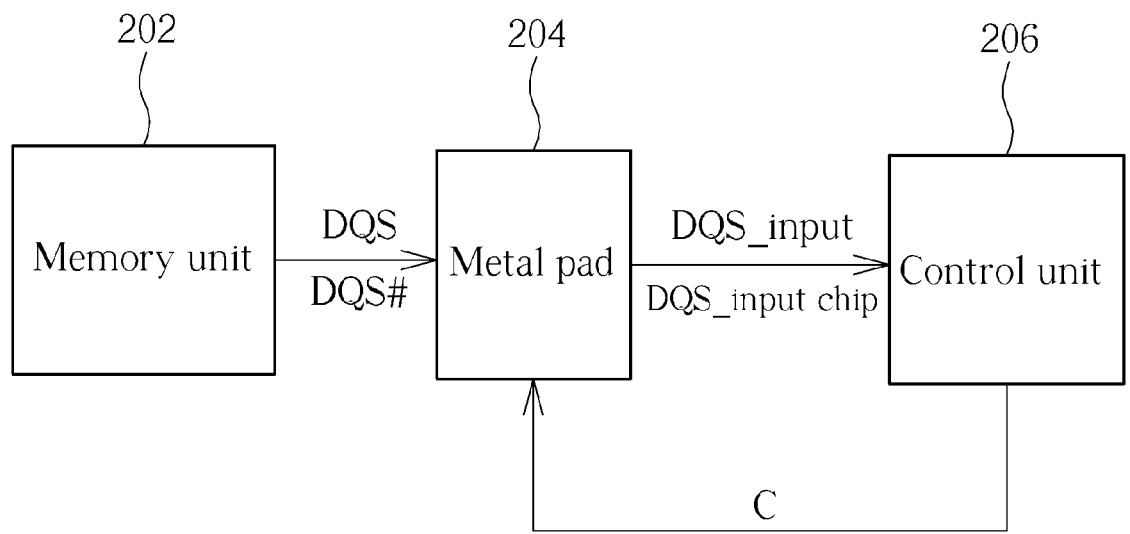
FIG. 2 shows a simplified diagram of an electronic device in accordance with an embodiment of the present invention.
Figure 3:
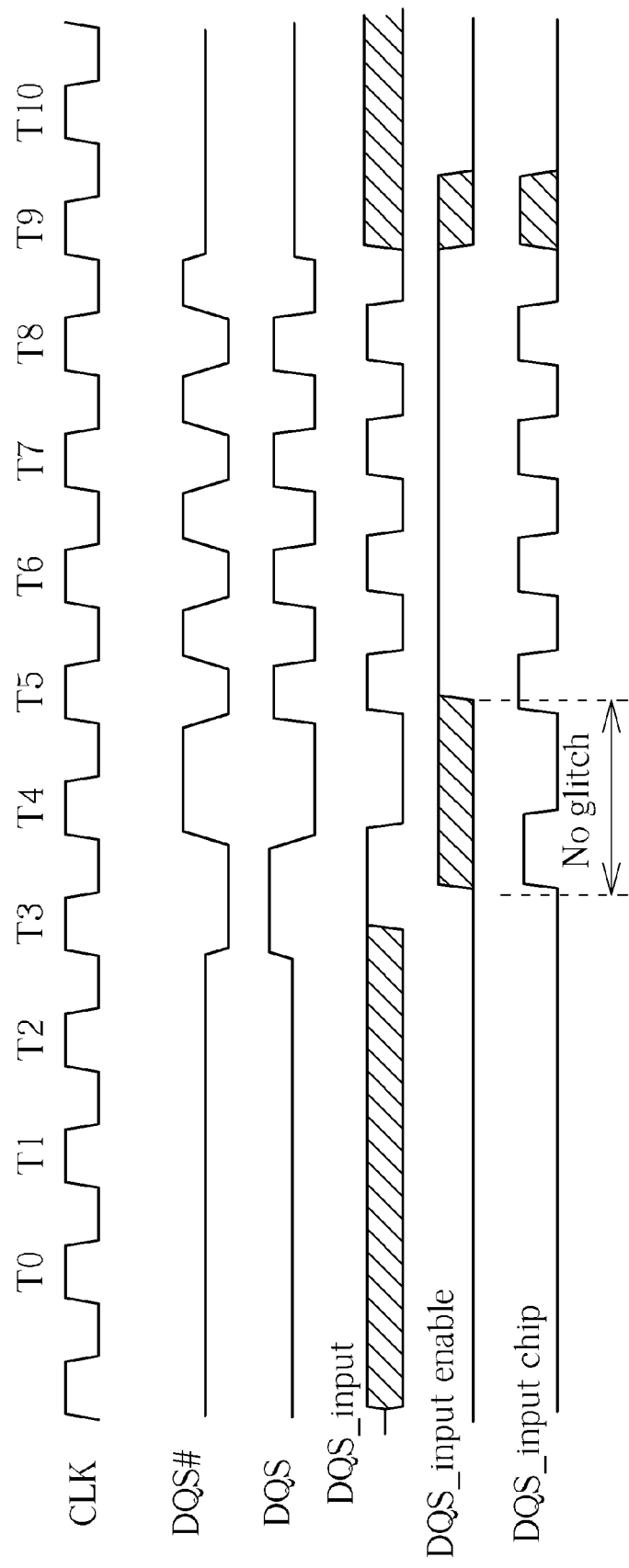
FIG. 3 shows a signal timing diagram of a clock signal CLK, a first data strobe signal DQS, a second data strobe signal DQS#, an input data strobe signal DQS_input, an input enable data strobe signal DQS_input enable, and an input chip data strobe signal DQS_input chip of the electronic device.

Please refer to FIG. 2 and FIG. 3. FIG. 2 shows a simplified diagram of an electronic device 200 in accordance with an embodiment of the present invention. As shown in FIG. 2, the electronic device 200 comprises: a memory unit 202, a metal pad 204, and a control unit 206, wherein the memory unit 202 can be a Double Data Rate Three Synchronous Dynamic Random Access Memory (DDR3 SDRAM). FIG. 3 shows a signal timing diagram of a clock signal CLK, a first data strobe signal DQS, a second data strobe signal DQS#, an input data strobe signal DQS_input, an input enable data strobe signal DQS_input enable, and an input chip data strobe signal DQS_input chip of the electronic device 200. As shown in FIG. 2, the metal pad 204 is coupled to the memory unit 202, and utilized for receiving a first data strobe signal DQS and a second data strobe signal DQS#, wherein the first data strobe signal DQS and the second data strobe signal DQS# are differential signals. The control unit 206 is coupled to the metal pad 204, and utilized for generating a control signal C during a time period T3 to control the first data strobe signal DQS and the second data strobe signal DQS# received by the metal pad 204, to pull up a level of the first data strobe signal DQS and to pull down a level of the second data strobe signal DQS# during the time period T3, so as to make the first data strobe signal DQS and the second data strobe signal DQS# have a voltage difference. As shown in FIG. 3, the time period T3 is a time period of the control unit 206 performing a reading operation. Thus, the present invention can eliminate a glitch cause by the first data strobe signal DQS and the second data strobe signal DQS# having the same voltage level. In other words, the present invention can avoid inputting the glitch due to uncertainty of switch time of the input enable data strobe signal DQS_input enable, and thus the present invention can avoid problems of catching wrong data. In addition, please note that the above embodiment is only for an illustrative purpose and is not meant to be a limitation of the present invention. For example, the time period of the control unit 206 performing a reading operation can be changed to the time period T2 or T1 according to different design requirement.

Briefly summarized, compared with prior art, since the electronic device and the control method for the electronic device disclosed by the present invention can make the first signal and the second signal have a voltage difference during the specific time period, the present invention an eliminate a glitch and avoid problems caused by inputting the glitch.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device, comprising:
    a memory unit;
    a metal pad, coupled to the memory unit, and utilized for receiving a first signal and a second signal from the memory unit; and
    a control unit, coupled to the metal pad, and utilized for generating a control signal during a specific time period to control the first signal and the second signal received by the metal pad, to pull up a level of the first signal and to pull down a level of the second signal during the specific time period, so as to make the first signal and the second signal have a voltage difference.

2. The electronic device of claim 1, wherein the specific time period is a time period of the control unit performing a reading operation.

3. The electronic device of claim 1, wherein the memory unit is a Double Data Rate Three Synchronous Dynamic Random Access Memory (DDR3 SDRAM).

4. The electronic device of claim 1, wherein the first signal and the second signal are data strobe signals (DQS).

5. The electronic device of claim 1, wherein the first signal and the second signal are differential signals.

6. A control method for an electronic device comprising a memory unit, the control method comprising:
    utilizing a metal pad coupled to the memory unit to receive a first signal and a second signal from the memory unit; and
    utilizing a control unit coupled to the metal pad to generate a control signal during a specific time period to control the first signal and the second signal received by the metal pad, to pull up a level of the first signal and to pull down a level of the second signal during the specific time period, so as to make the first signal and the second signal have a voltage difference.

7. The control method of claim 6, wherein the specific time period is a time period of the control unit performing a reading operation.

8. The control method of claim 6, wherein the memory unit is a Double Data Rate Three Synchronous Dynamic Random Access Memory (DDR3 SDRAM).

9. The control method of claim 6, wherein the first signal and the second signal are data strobe signals (DQS).

10. The control method of claim 6, wherein the first signal and the second signal are differential signals.

* * * * *